United States Patent [19]
Mishiro

[11] Patent Number: 5,799,392
[45] Date of Patent: Sep. 1, 1998

[54] METHOD OF MANUFACTURING A CONNECTING STRUCTURE OF PRINTED WIRING BOARDS

[75] Inventor: Kinuko Mishiro, Kawasaki, Japan

[73] Assignee: Fujitsu Limited, Kawasaki, Japan

[21] Appl. No.: 653,401

[22] Filed: May 24, 1996

[30] Foreign Application Priority Data

Nov. 17, 1995 [JP] Japan ................. 7-299861

[51] Int. Cl.⁶ ............................................. H05K 3/36
[52] U.S. Cl. ...................... 29/830; 29/840; 156/273.3; 156/273.5; 156/275.5; 156/275.9
[58] Field of Search ............... 29/830, 840; 156/273.3, 156/273.5, 275.5, 275.7; 174/94 R

[56] References Cited

U.S. PATENT DOCUMENTS

| 4,157,932 | 6/1979 | Hirata ........................ 29/830 X |
| 4,554,033 | 11/1985 | Derr et al. .................. 29/830 X |
| 4,654,965 | 4/1987 | Vehana et al. ................ 29/830 |
| 5,065,505 | 11/1991 | Matsubara et al. ............ 29/830 |
| 5,092,032 | 3/1992 | Marakami .................... 29/830 |
| 5,112,262 | 5/1992 | Ohata et al. . |
| 5,223,965 | 6/1993 | Ota et al. ................... 359/88 |
| 5,235,741 | 8/1993 | Mase ......................... 29/830 |
| 5,311,341 | 5/1994 | Hirai ......................... 359/88 |
| 5,318,651 | 6/1994 | Matsui et al. ................ 29/830 X |
| 5,328,087 | 7/1994 | Nelson et al. ................ 29/830 X |
| 5,360,943 | 11/1994 | Mori et al. .................. 174/84 R |
| 5,375,003 | 12/1994 | Hirai ......................... 359/88 |
| 5,384,952 | 1/1995 | Matsui ....................... 29/830 X |
| 5,431,571 | 7/1995 | Hanrahan et al. ............. 29/830 X |
| 5,502,889 | 4/1996 | Casson et al. ................ 29/830 |
| 5,526,563 | 6/1996 | Tamaki et al. ................ 29/830 |
| 5,592,365 | 1/1997 | Sugimoto et al. . |
| 5,600,103 | 2/1997 | Odaira et al. . |

FOREIGN PATENT DOCUMENTS

| 2-173725 | 7/1990 | Japan . |
| 5-100238 | 4/1993 | Japan . |
| 5-113573 | 5/1993 | Japan . |

OTHER PUBLICATIONS

Kawaguchi, H., *Nikkei Microdevices*, Apr. 1995, pp. 137–139. (In Japanese).

*Primary Examiner*—Carl J. Arbes
*Attorney, Agent, or Firm*—Staas & Halsey

[57] ABSTRACT

A method of manufacturing a connecting structure of first and second printed wiring boards each having an electrode for conductively connecting to each other using a conductive film. A first printed wiring board with a resist film bonds to a second printed wiring board directly or using conductive film or bonding film. Both electrodes can be bonded using a conductive film and/or a bonding film. The resist film on one printed wiring board can be bonded to the electrode of another printed wiring board using a conductive film, or both resist films can be bonded using a conductive film.

15 Claims, 5 Drawing Sheets

METHOD OF MANUFACTURING A CONNECTING STRUCTURE OF PRINTED WIRING BOARDS

BACKGROUND OF THE INVENTION

1. Field of the Invention

The present invention relates to a method of manufacturing a connecting structure of printed wiring boards, particularly to a method of connecting a flexible printed wiring board to a rigid one, in which method a desired peel strength can be attained even when an external force is exerted as to tend to peel or separate a printed wiring board from another or when an external force is exerted on the printed wiring boards in a direction parallel with the printed wiring boards and opposite to each other.

Connecting electrodes of a flexible printed wiring board for carrying a signal and supplying power, to those of a glass-epoxy main printed wiring board for mounting a display panel thereon, for example, is widely practiced in the field of electronics, especially in liquid crystal display devices. The liquid crystal display devices having such connecting structure of printed wiring boards, are widely used in portable telephones, desk-top computers, personal computers, etc.

Such electronic equipment is often used in an environment where temperature and humidity are is not controlled. For example, when a portable telephone is carried in a vehicle which is often left in the sun for a long time in summer, the temperature around the telephone occasionally goes up to 85° C. Therefore, a connecting structure of printed wiring boards which connects the flexible printed wiring board to the main printed wiring board reliably even in such environments, is in great demand.

2. Description of the Related Art

FIG. 1 is an exploded perspective view of a connecting structure of printed wiring boards. FIG. 2 is a side elevational view of a connecting structure of related art.

In FIGS. 1 and 2; the reference numbers 1 and 3 represent a main printed wiring board (abbreviated to MPWB) and a flexible printed wiring board (abbreviated to FPWB), respectively. The numbers 2 and 4 represent electrodes provided on the main and flexible printed boards, respectively. The number 5 represents a conductive film for electrically connecting the electrodes 2 and 4. The numbers 7 and 8 represent a first resist film and a second resist film for protecting wiring patterns printed on the flexible and main printed wiring boards 3 and 1 respectively, from a chemical change.

Referring to FIG. 2, the conventional connecting structure is detailed below:

The main printed wiring board 1 is made of glass epoxy. The flexible printed wiring board 3 is made of polyester. The electrode 2 provided on the main printed wiring board 1 is formed by laminating 20–40 micron-thick cupper leaf, 2–3 micron-thick nickel leaf and approx. 1 micron-thick gold leaf into layers.

The FPWB electrodes 4 and wiring patterns provided on the flexible printed wiring board 3 are made of silver paste. An anisotropic conductive film, which is made of epoxy-group resin mixed with conductive particles of nickel or gold-plated plastic particles, is usually used as the conductive film 5.

A reason that it does not use solder is to avoid any possibility of lead included therein dissolving in acid water, mixing in and contaminating the underground water.

Another reason is that it can interconnect favorably a plurality of electrodes without patterning therebetween, because it has high insulation and high conductivity in the direction of plane and thickness, respectively. Epoxy- or acrylic-group resin is used for a reinforcement resin 6.

FIG. 3 is a flowchart illustrating a process of manufacturing the connecting structure of FIG. 2, by which the printed wiring boards are connected. Here, a rectangle shows the material and an elongated hexagon shows each manufacturing process.

(a) Making a tape of an anisotropic conductive film covered with cover films on both sides.

(b) Cutting the anisotropic-conductive-film tape in a required length and peeling one of the cover films off the tape.

(c) Sticking the side of the anisotropic-conductive-film tape, which side the cover film was peeled off, onto the bonding area of the MPWB electrode 2. (Hereinafter, an area of the connecting structure where an end portion of the flexible printed wiring board 3 is connected (or bonded) to the main printed wiring board I is called a bonding area.)

(d) Connecting the anisotropic conductive film 5 provisionally to the main printed wiring board 1 by applying a pressure of approx. 10 kg/cm$^2$ on the bonding portion for several seconds at a temperature of approx. 80° C.

(e) Peeling the cover film off the other side of the tape to complete a preparatory process on the side of the main printed wiring board 1.

(f) Aligning the FPWB electrode 4 with the MPWB electrode 2.

(g) Connecting both electrodes 2 and 4 regularly by applying a pressure of 40 kg/cm$^2$ on both printed wiring boards for about 20 seconds at a temperature of approx. 160° C. About 1 minute is required to complete this process.

(h) Applying the reinforcement resin 6 on the MPWB electrode 2 and on the flexible printed wiring board 3, as shown in FIG. 2, and finally hardening the reinforcement resin 6 at a temperature of approx. 80° C. for 1 hour or at a normal temperature for 24 hours.

In the conventional method, the reinforcement resin 6 is useful in preventing the connecting portion of the printed wiring boards from quickly decreasing in peel strength under the environment of high temperature and high humidity.

Regarding the peel strength which is a force required to peel or separate the flexible printed wiring board 3 from the main printed wiring board 1 by pulling upward a flexible (or not connected) part of the flexible printed wiring board 3, the strength without the reinforcement resin 6 is 300 g/cm immediately after both electrodes 2, 4 are bonded regularly or thereafter when both printed wiring boards are left at a normal temperature.

The strength is larger than the force exerted on the bonding area of both printed wiring boards of a portable telephone carried in a car. However, when both connected printed wiring board are left at 85° C. and 85% RH for 1,000 hours, the peel strength decreases even to 10 g/cm or less. Therefore, the peel strength decreases under the force exerted on the bonding area between the printed wiring boards of a portable telephone carried in a car. Also, the peel strength after the printed wiring boards were left at 85° C. and 85% RH for 1,000 hours, decreases tremendously when a force is exerted on the bonding area in a direction parallel with the electrodes and opposite to each other.

The reinforcement resin 6 is supposed to improve the peel strength, but actually the peel strength may decrease greatly when both printed wiring boards are left at 85° C. and 85% RH for 1,000 hours. This is because it fails to directly reinforce the portion where a separation may develop as described later.

As a portable telephone is subjected to vibrations when carried in a running car, the flexible printed wiring board 3, which is connected only at an end to the main printed wiring board 1, vibrates in parallel with and perpendicularly to the surface of the main printed wiring board 1. Besides, the portable telephone is often left in high temperature within the car as described above. If a portable telephone is carried in a private car, for example, which is used less frequently, the time that the portable telephone is left at high temperature will reach 1,000 hours easily in three months in summer. Therefore, the conventional connecting structure cannot attain the desired reliability of the connected electrodes.

Moreover, requiring the process to apply and harden the reinforcement resin 6 remarkably decreases the productivity in manufacturing the connecting structure of the printed wiring boards. As described with FIG. 3, whereas the time required to connect the main and flexible printed wiring board 3 is approx. one minute at a temperature of approx. 160° C., the time required to harden the reinforcement resin 6 is one hour at approx. 80° C. or 24 hours at the normal temperature, eventually causing the productivity to decrease remarkably.

SUMMARY OF THE INVENTION

It is an object of the present invention to provide a method of manufacturing a connecting structure of printed wiring boards, in which desired connection strength can be attained even when a force is exerted as to tend to separate a printed wiring board from another or when a force is exerted on the bonding area between the electrodes in a direction parallel therewith and opposite to each other.

It is an other object of the present invention to provide a method of manufacturing a connecting structure of printed wiring boards, which is high in productivity.

To achieve the above and other objects of a method of manufacturing a connecting structure of first and second printed wiring boards each having an electrode provided thereon, for conductively connecting to each other using a conductive film, the present invention covers at least one of the printed wiring boards with a resist film, and bonds the resist film of the at least one of the printed wiring boards to the other printed wiring board directly or using a conductive film or a bonding film.

Also, the present invention bonds both electrodes using a conductive film and/or a bonding film, bonds the resist film of a printed wiring board to the electrode of the other printed wiring board using a conductive film or bonds both resist films using a conductive film.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 4:
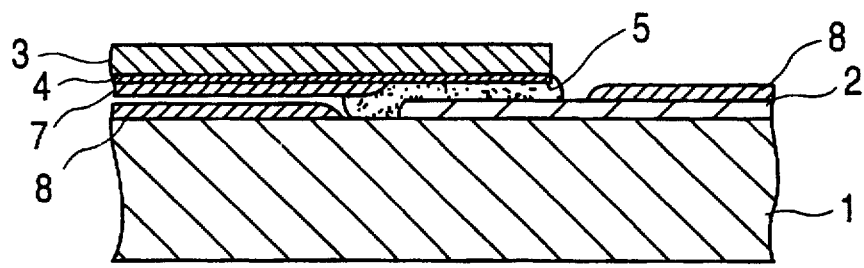
FIG. 4 is a side elevational view of a connecting structure of the first embodiment of the present invention.

FIG. 4 is a side elevational view of a connecting structure of the first embodiment of the present invention.

In FIG. 4, the reference numbers 1 and 3 represent a main printed wiring board (abbreviated to MPWB) and a flexible printed wiring board (abbreviated to FPWB), respectively. The numbers 2 and 4 represent electrodes (including electrically conductive wirings) provided on the main and flexible printed boards, respectively. The number 5 represents a conductive film for electrically connecting the electrodes 2 and 4. The numbers 7 and 8 represent first and second resist films (or insulator films or layers) provided on the flexible and main printed wiring boards respectively, for protecting wiring patterns printed thereon from a chemical change.

Figure 1:
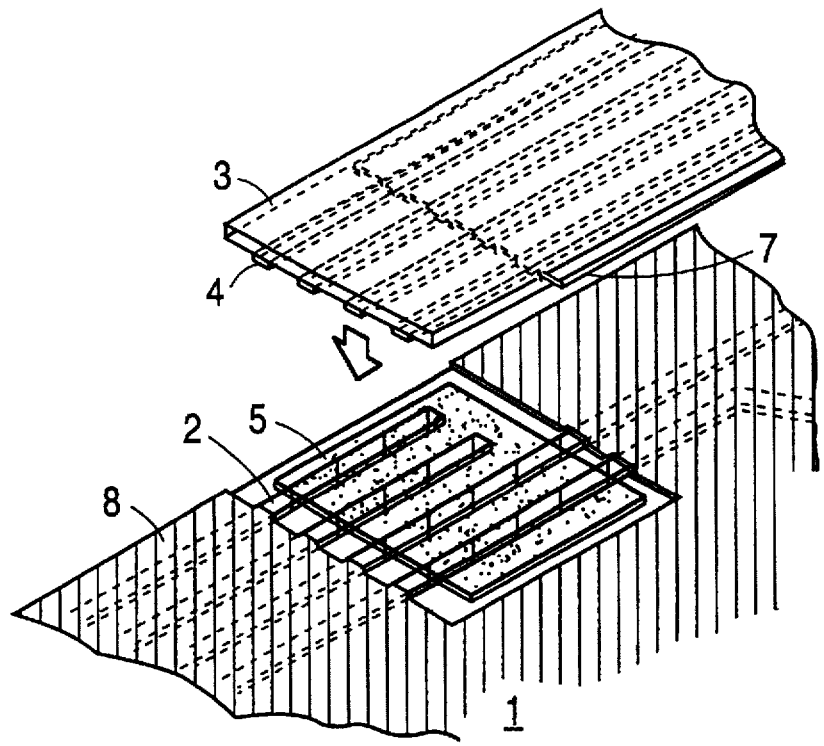
FIG. 1 is an exploded perspective view of a connecting stucture of printed wiring boards.
Figure 2:
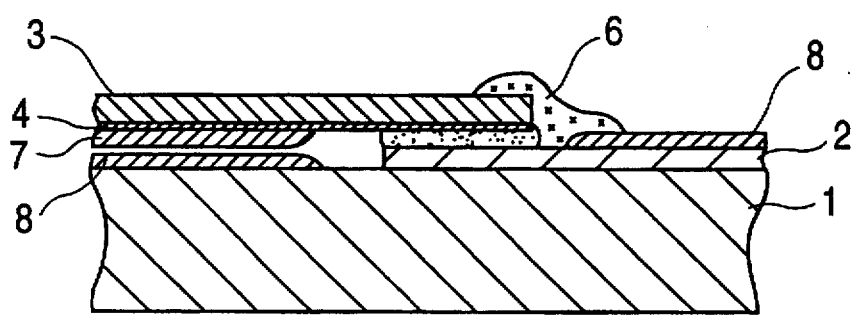
FIG. 2 is a side elevational view of a connecting stucture of related art.

The material used for the connecting structure is basically the same as that of FIG. 2. The materials of the main and flexible printed wiring boards 1, 3 are glass epoxy and polyester, respectively. The MPWB electrode 2 provided on the main printed wiring board 1 is formed by laminating layers each of copper, nickel and gold. The FPWB electrode 4 provided on the flexible printed wiring board 2 is made of silver paste. The anisotropic conductive film 5 is made of epoxy-group resin mixed with conductive particles of nickel or gold-plated plastic particles.

The connecting structure of FIG. 4 features that the anisotropic conductive film 5 connects both printed wiring boards, with the anisotropic conductive film 5 overlapping the first resist film 7 which is provided on the flexible printed wiring board 3.

The material of the first resist film 7 is polyester-group resin as is the flexible printed wiring board 3. Since the polyester-group resin is low in viscosity when applied to the flexible printed wiring board 3, it fits well in the surface of the silver paste-made FPWB electrode 4.

Since the polyester-group resin is thus hardened to make the first resist film 7, the peel strength between the first resist film 7 and the silver paste-made FPWB electrode 4 increases. Further, in the process of hardening, the first resist film 7 has innumerable recesses formed in the surface opposite to the FPWB electrode 4. Thus, when both printed wiring boards are normally connected together using the anisotropic conductive film 5, the material of the anisotropic conductive film enters the recesses, accordingly increasing the peel strength between the first resist film 7 and the anisotropic conductive film 5.

As the flexible printed wiring board 3 of the conventional connecting structure vibrates, the stress of the anisotropic conductive film 5 concentrates on the first bonding end, eventually pulling the FPWB electrode 4 toward the anisotropic conductive film 5. (Hereinafter, an area of the connecting structure where an end portion of the flexible printed wiring board 3 is connected (or bonded) to the main printed wiring board 1 is called a bonding area, and an end of the bonding area where the very end of the flexible printed wiring board 3 is located is called a first bonding end; the other end is called a second bonding end.)

Since the peel strength between the silver paste-made FPWB electrode 4 and the polyester-made flexible printed wiring board 3 decreases as they are subjected to high temperature and high humidity for a long time, the FPWB electrode 4 starts separating from the flexible printed wiring board 3 at the portion near the anisotropic conductive film 5 on the side of the first bonding end. Then, the stress concentration point of the anisotropic conductive film 5 moves toward the first bonding end, causing the flexible printed wiring board 3 to peel off there.

Repetitions of this process destroy the bonding area between the printed wiring boards, regardless of whether the flexible printed wiring board 3 vibrates perpendicularly to or in parallel with the main printed wiring board 1.

In the connecting structure of FIG. 4, in contrast, when the first bonding end vibrates relatively to the main printed wiring board 1, a force is exerted on a tip of the bonding area between the anisotropic conductive film 5 and the first resist film 7, on the side of the first bonding end. However, since the peel strength between the anisotropic conductive film 5 and first resist film 7 and also that between the first resist film 7 and FPWB electrode 4 are both high enough, the stress induced on the first bonding end does not concentrate on the tip of the bonding area between the anisotropic conductive film 5 and first resist film 7, but is distributed over the entire first resist film 7.

Thus, the FPWB electrode 4 hardly separates from the flexible printed wiring board 3 because the stress induced on the bonding area between them is distributed, even if the strength between them decreases as they are exposed to high temperature for long. This is true regardless of whether the flexible printed wiring board 3 vibrates perpendicularly to or in parallel with the main printed wiring board 1.

We made an experiment on a connecting structure manufactured according to FIG. 4. The experiment showed that the peel strength is about 600 g/cm after the structure was left at 85° C. and 85% RH for 1000 hours. It is twice the strength (300 g/cm) which the structure of FIG. 2 has before subjected to a high temperature and exceeds greatly the force exerted on the bonding area of both printed wiring boards when a portable telephone is carried in a car. Therefore, the connecting structure of FIG. 4 can improve the reliability of the bonding area greatly.

Figure 3:
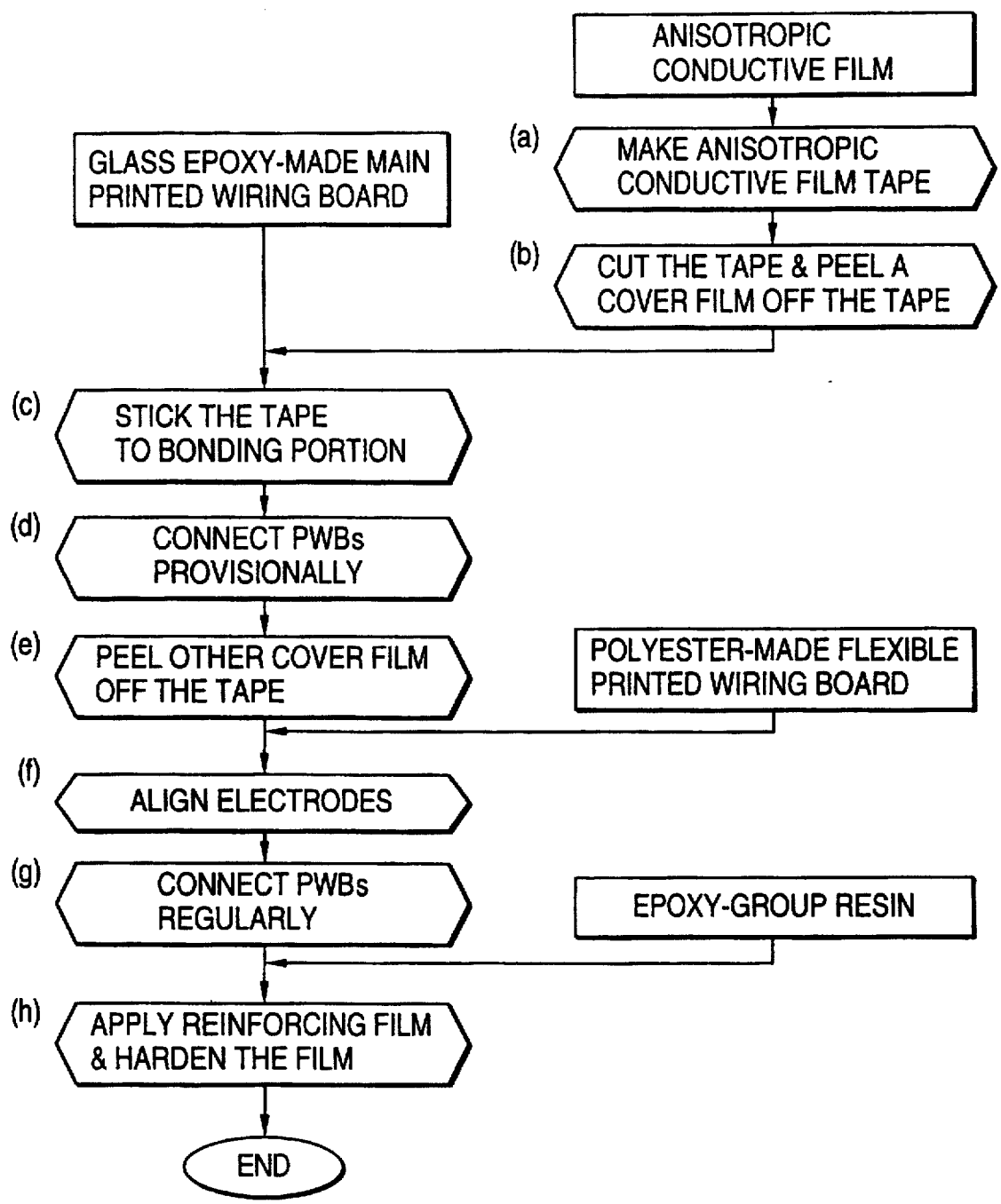
FIG. 3 is a flowchart illustrating a process of manufacturing the connecting structure of FIG. 2.

The process for manufacturing the connecting structure of FIG. 4 is basically the same as that of FIG. 3 except that the process for applying and hardening the material of the reinforcement film 6 is unnecessary.

Figure 5:
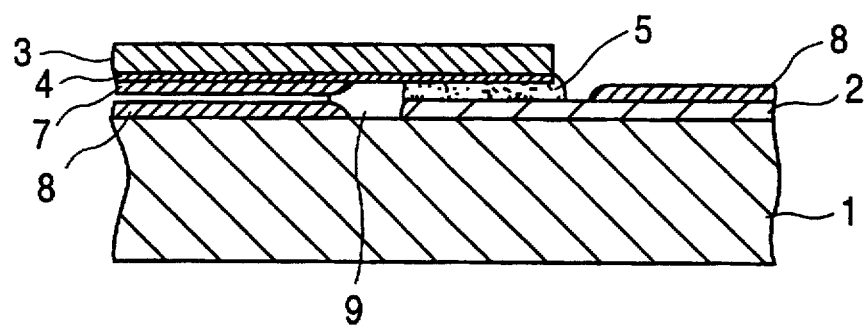
FIG. 5 is a side elevational view of a connecting structure of the first embodiment of the present invention.

FIG. 5 is a side elevational view of a connecting structure of the first embodiment of the present invention.

In FIG. 5, the reference numbers 1 and 3 represent a main printed wiring board and a flexible printed board, respectively. 2 and 4 represent electrodes provided on the main and flexible printed boards, respectively. 5 represents a conductive film for interconnecting the electrodes 2 and 4. 7 and 8 represent first and second resist films for protecting wiring patterns printed on the flexible and main printed wiring boards respectively, from a chemical change. 9 represents a bonding film.

The materials of the main and flexible printed wiring boards, the electrodes provided on the printed wiring boards and the conductive film 5 are basically the same as those of FIG. 4. The material of the newly-introduced bonding film 9 is epoxy-group resin.

The connecting structure of FIG. 5 is the same as that of FIG. 4 in that a stress concentration is prevented by bonding the newly-introduced bonding film 9 to the first resist film 1 and to the anisotropic conductive film 5. However, it can have the same effect as the conventional structure, only by adding general-use epoxy-group resin to the conventional one with the width of the anisotropic conductive film 5, which is a comparatively special material, being same as that of the conventional one.

Figure 6:
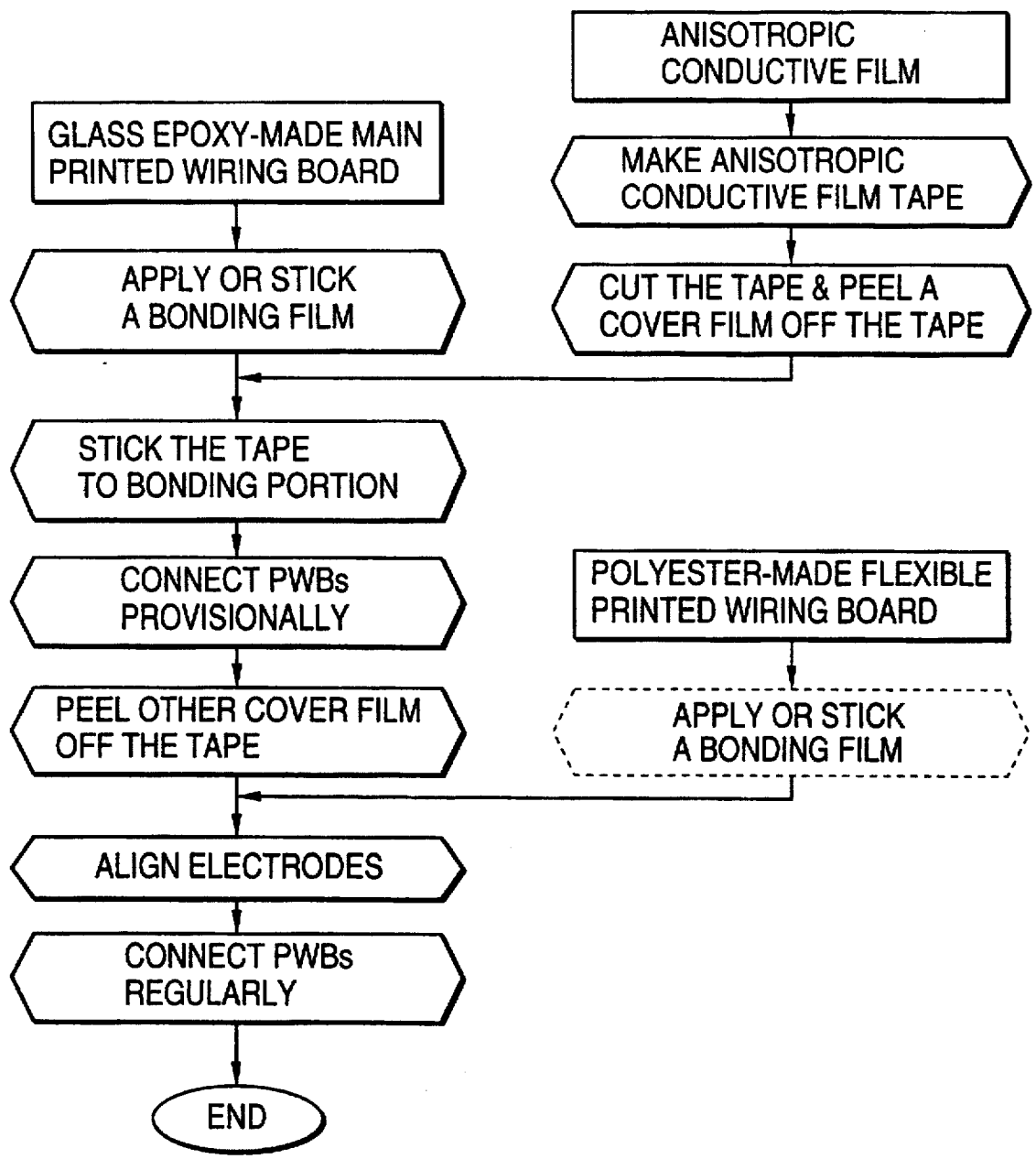
FIG. 6 is a flowchart illustrating a process for manufacturing the connecting structure of FIG. 5.

FIG. 6 is a flowchart illustrating a process for manufacturing the connecting structure of FIG. 5.

The manufacturing process is basically the same as that of FIG. 3 except that a process for applying epoxy-group resin to the main or flexible printed wiring board, is added. Since the anisotropic conductive film 5 and the bonding film 9 are both made of epoxy-group resin, the peel strength of the connecting structure of FIG. 5 is quite the same as that of FIG. 4.

Epoxy-group resin is used for forming the bonding film 9 in the connecting structure of FIG. 6. Instead, a similar bonding film can also be formed by removing conductive particles from the anisotropic conductive film, making a tape of the film with the film covered by a protective cover film and sticking the tape to the main printed wiring board 1. This process is quite the same as that for sticking the anisotropic-conductive-film tape in manufacturing the conventional connecting structure.

Figure 7:
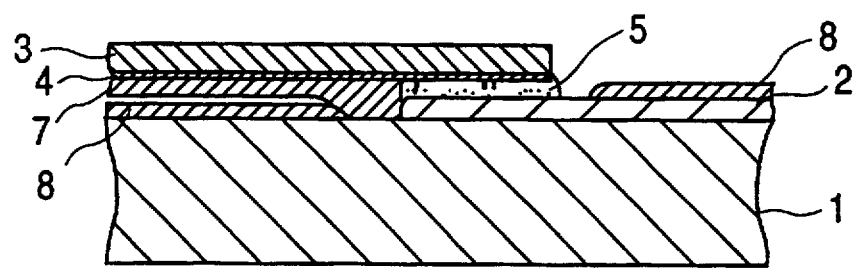
FIG. 7 is a side elevational view of a connecting structure of the third embodiment of the present invention.

FIG. 7 is a side elevational view of a connecting structure of the third embodiment of the present invention.

In FIG. 7, the reference numbers 1 and 3 represent a main printed wiring board and a flexible printed board, respectively. 2 and 4 represent electrodes provided on the main and flexible printed boards, respectively. 5 represents a conductive film for interconnecting the electrodes 2 and 4. 7 and 8 represent first and sedond resist films for protecting wiring patterns printed on the flexible and main printed wiring boards respectively, from a chemical change.

The connecting structure of FIG. 7 features that the first resist film 7 is bonded directly to the main printed wiring board 1. It is also advantageous in that it does not require extra materials for connecting both printed wiring boards, compared with the conventional structure.

The manufacturing process (not shown in a figure) for the connecting structure of FIG. 7 need only add a process to re-apply polyester-group resin on and near the bonding area to thicken that portion of the first resist film 7, following the process to form the first resist film 7 on the flexible printed wiring board 3.

Although FIG. 7 exemplifies a method of bonding the first resist film 7 provided on the flexible printed wiring board 3, to the main printed wiring board 1, the present invention is not necessarily limited to the method. That is, the second resist film 8 provided on the main printed wiring board 1 may be bonded directly to the flexible printed wiring board 3.

Figure 8:
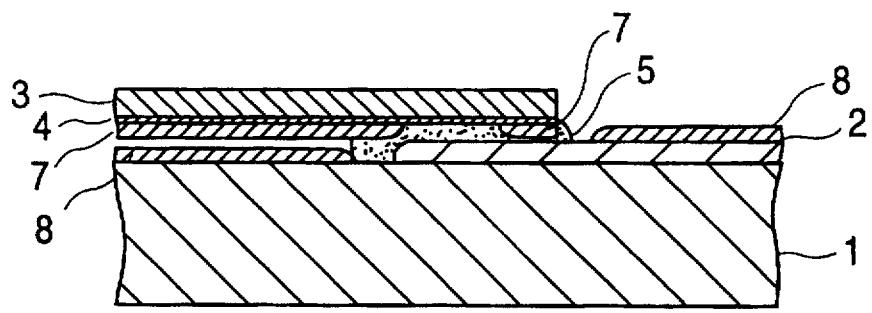
FIG. 8 is a side elevational view of a connecting structure of the fourth embodiment of the present invention.

FIG. 8 is a side elevational view of a connecting structure of the fourth embodiment of the present invention.

In FIG. 8, The numbers 1 and 3 represent a main printed wiring board and a flexible printed board, respectively. 2 and 4 represent electrodes provided on the main and flexible printed boards, respectively. 5 represents a conductive film for interconnecting the electrodes 2 and 4. 7 and 8 represent first and second resist films for protecting wiring patterns printed on the flexible and main printed wiring boards respectively, from a chemical change.

The connecting structure of FIG. 8 is manufactured by applying polyester-group resin additionally to the second bonding end and hardening the resin by way of forming the first resist film 7 in manufacturing the connecting structure of FIG. 4 and thereafter connecting the both printed wiring boards using the anisotropic conductive film 5. In the connecting structure of FIG. 4, if the peel strength increases near the tip of the MPWB electrode 2, the flexible printed wiring board 3 may vibrate around the tip, in parallel with the plane of the bonding area.

The connecting structure of the fourth embodiment features that it can reinforce the peel strength at the second bonding end. The manufacturing process for the connecting structure of FIG. 8 is basically the same as that of FIG. 4. Therefore, the fourth embodiment has an advantage that it can achieve the aforesaid feature by the same manufacturing process as the connecting structure of FIG. 4.

Illustrated above referring to FIG. 8 is the method, in which, based on the connecting structure of FIG. 4, polyester-group resin is applied also to the second bonding end and is hardened and thereafter, the flexible printed wiring board 3 is connected to the main printed wiring board 1 using the anisotropic conductive film 5. However, the present invention is not necessarily limited to this method, but equally applicable to other modifications. For example, the method may be based on the connecting structure of FIG. 5 or FIG. 7.

Also, the film formed on the second bonding end is not limited to the polyester-group resin used for the resist film. It may be the epoxy-group resin used for the bonding film of the connecting structure of FIG. 5. Further, the resist film or the bonding film 9 may be bonded to the first bonding end without using the anisotropic conductive film 5, but directly to the main printed wiring board 1.

Figure 9:
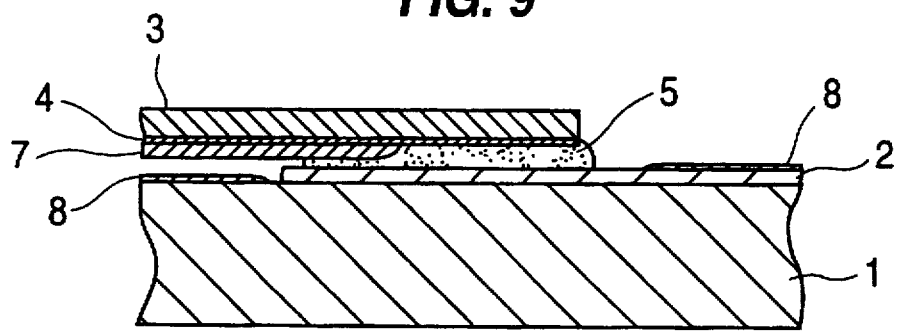
FIG. 9 is a side elevational view of a connecting structure of the fifth embodiment of the present invention.

FIG. 9 is a side elevational view of a connecting structure of the fifth embodiment of the present invention.

The connecting structure of FIG. 9 features that the anisotropic conductive film 5 connects both printed wiring boards, with the anisotropic conductive film 5 sandwiched between the FPWB first resist film 7 and the MPWB electrode 2 in a part of the bonding area. It can attain high peel strength according to the same principle as that of FIG. 4.

Figure 10:
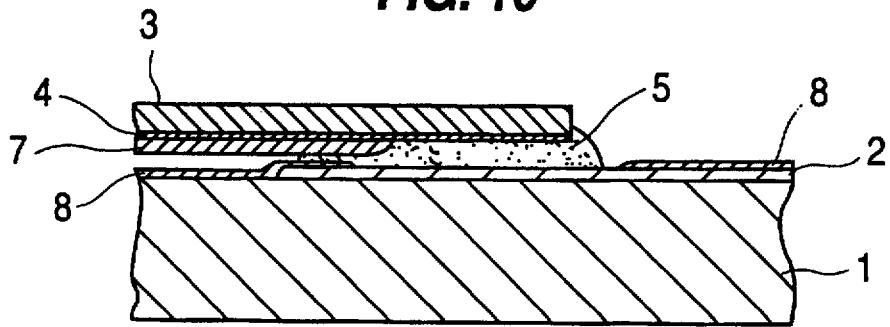
FIG. 10 is a side elevational view of a connecting structure of the sixth embodiment of the present invention.

FIG. 10 is a side elevational view of a connecting structure of the sixth embodiment of the present invention.

The connecting structure of FIG. 10 features that the anisotropic conductive film 5 connects both printed wiring boards, with the anisotropic conductive film 5 sandwiched between the FPWB first resist film 7 and the MPWB second resist film 8 in a part of the bonding area. It can attain high peel strength according to the same principle as that of FIG. 4.

Throughout the above examples, a usual combination of a flexible printed wiring board and a rigid one was explained. However, the present invention is not limited to that combination, but both printed wiring boards may be rigid ones or flexible ones.

Furthermore, the anisotropic conductive film 5 was exemplified throughout as a medium to interconnect the electrodes 2, 4 because of its characteristic that it has high insulation and high conductivity in the direction of plane and thickness respectively, to facilitate interconnection of the minute electrodes. However, the-present invention is not limited to the anisotropic conductive film. A conductive film with patterns provided thereon may bring a similar effect.

As described above, the present invention provides an improved connecting structure which can increase the peel strength of the bonding portion between two printed wiring boards. The connecting structure is useful for various electronic equipment, particularly for that mounted on or carried in a vibrative body. Especially, it improves the reliability of the bonding area between the printed wiring boards of a portable telephone carried in a vehicle which is subjected to vibration while running and to high temperature while parked in the sun. It also provides an improved connecting structure which is high in productivity and therefore low in manufacturing cost.

What is claimed is:

1. A method of manufacturing a connecting structure for interconnecting first and second printed wiring boards at a connecting area formed between respective surfaces of the first and second printed wiring boards facing each other, electrodes being provided on the surfaces of the first and second printed wiring boards for conductively connecting the first and second printed wiring boards to each other, said method comprising the steps of:

coating the connecting surface of the first printed wiring board, excluding the connecting area, with a resist film;

bonding the resist film to a portion on the connecting surface of the second printed wiring board adjacent to the connecting area; and forming a conductive film in the connecting area so as to interconnect the first and second printed wiring boards.

2. A method of manufacturing a according to claim 1, wherein said forming step also includes forming the conductive film to extend from the connecting area to the resist film and to the connecting surface of the second printed wiring board, such that the resist film is bonded to the portion on the connecting surface of the second printed wiring board through the conductive film.

3. A method of manufacturing according to claim 1, wherein said bonding step bonds the resist film to the connecting surface of the second printed wiring board by using a bonding film formed therebetween.

4. A method of manufacturing according to claim 3, wherein said bonding step extends the bonding film to the connecting area, so that the conductive film bonds to the bonding film.

5. A method of manufacturing according to claim 3, wherein said forming step forms the conductive film with the bonding film bonded between the conductive film and the connecting surface of the first printed wiring board, on a side opposite the resist film.

6. A method of manufacturing according to claim 1, wherein the first and second printed wiring boards are made of glass epoxy and polyester, respectively.

7. A method of manufacturing according to claim 1, wherein the conductive film is an anisotropic conductive film.

8. A method of manufacturing according to claim 6, wherein the electrode provided on the second printed wiring board is made of silver paste.

9. A method of manufacturing according to claim 7, wherein the anisotropic conductive film is made of epoxy-group resin mixed with conductive particles.

10. A method of manufacturing a connecting structure for interconnecting first and second printed wiring boards at a connecting area formed between respective surfaces of the first and second printed wiring boards facing each other, electrodes being provided on the surfaces of the first and second printed wiring boards for conductively connecting the first and second printed wiring boards to each other, said method comprising the steps of:

coating, with a resist film, the connecting surface of at least one of the first and second printed wiring boards, including a part of the connecting area; and forming a conductive film in the connecting area so as to interconnect the first and second printed wiring boards.

11. A method of manufacturing according to claim 10, wherein the first and second printed wiring boards are made of glass epoxy and polyester, respectively.

12. A method of manufacturing according to claim 10, wherein the conductive film is an anisotropic conductive film.

13. A method of manufacturing a connecting structure of first and second printed wiring boards, each having an electrode provided thereon, for conductively connecting the first and second printed wiring boards to each other using a conductive film, said method comprising the steps of:

covering at least one of the printed wiring boards with a resist film; and bonding the resist film of the at least one of the printed wiring boards to the other printed wiring board, wherein the first and second printed wiring boards are made of glass epoxy and polyester, respectively, and wherein the electrode provided on the second printed wiring boards is made of silver paste.

14. A method of manufacturing according to claim 13, wherein the conductive film is an anisotropic conductive film.

15. A method of manufacturing according to claim 14, wherein the anisotropic conductive film is made of epoxy-group resin mixed with conductive particles.

* * * * *